United States Patent
Chen et al.

(10) Patent No.: US 6,331,724 B1
(45) Date of Patent: *Dec. 18, 2001

(54) SINGLE TRANSISTOR E²PROM MEMORY DEVICE WITH CONTROLLED ERASING

(75) Inventors: James T. Chen, Cupertino, CA (US); Atsuo Yagi, Shiobara-machi (JP)

(73) Assignee: Nippon Precision Circuits, Inc., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/997,407

(22) Filed: Dec. 23, 1997

Related U.S. Application Data

(63) Continuation of application No. 08/559,800, filed on Nov. 17, 1995, now Pat. No. 5,773,861.

(51) Int. Cl.⁷ .......................... H01L 29/76; H01L 29/94; H01L 31/062; H01L 31/119
(52) U.S. Cl. .................... 257/365; 365/104; 365/184; 365/185.03; 365/185.18; 365/185.22; 365/200
(58) Field of Search .................. 257/365; 365/185, 365/184, 104, 200, 185.03, 185.18, 185.22

(56) References Cited

U.S. PATENT DOCUMENTS

| | | | |
|---|---|---|---|
| 5,005,155 | * 4/1991 | Radjy et al. | 365/185 |
| 5,297,081 | * 3/1994 | Challa | 365/184 |
| 5,696,717 | * 12/1997 | Koh | 365/185.22 |
| 5,870,335 | * 2/1999 | Khan et al. | 365/185.18 |
| 5,886,927 | * 3/1999 | Takeuchi | 365/185.22 |

FOREIGN PATENT DOCUMENTS 6-318710    11/1994    (JP) .

* cited by examiner

Primary Examiner—Olik Chaudhuri
Assistant Examiner—Howard Weiss
(74) Attorney, Agent, or Firm—Schulte Roth & Zabel, LLP; Joel E. Lutzker; Donna L. Angotti

(57) ABSTRACT

A semiconductor memory cell device exhibiting superior cell reliability comprising a dual layer floating gate wherein the thin upper layer of the floating gate overlaps the edges of surrounding field insulating regions and has rounded edges to minimize leakage concerns. The tunnel dielectric separating the dual layer floating gate from the substrate comprises a layer of uniform thickness which is grown prior to the formation of the field insulating regions. The Fowler-Nordheim tunneling mechanism is used for programming and erasing the inventive cells in a programming process flow which comprises flash programming all cells on a word line, sensing current on a selected cell, and selectively erasing the charge on the cell by applying a higher voltage on the intersecting bit line than is applied to the word line, until the sensed current is as desired.

8 Claims, 16 Drawing Sheets

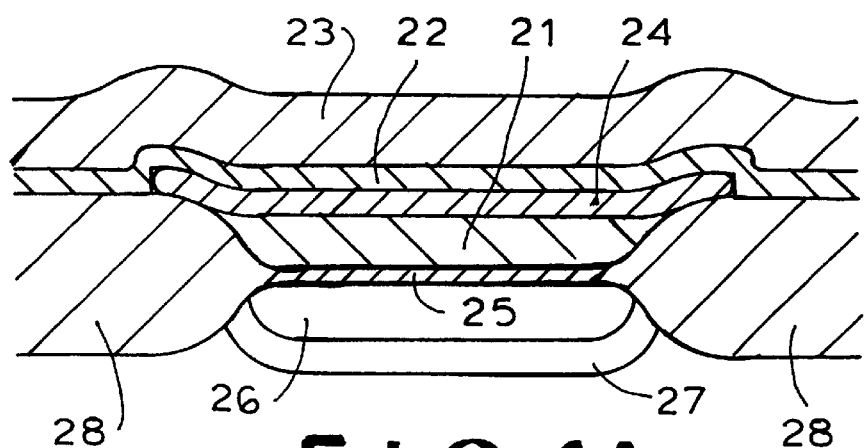
F I G. 4A
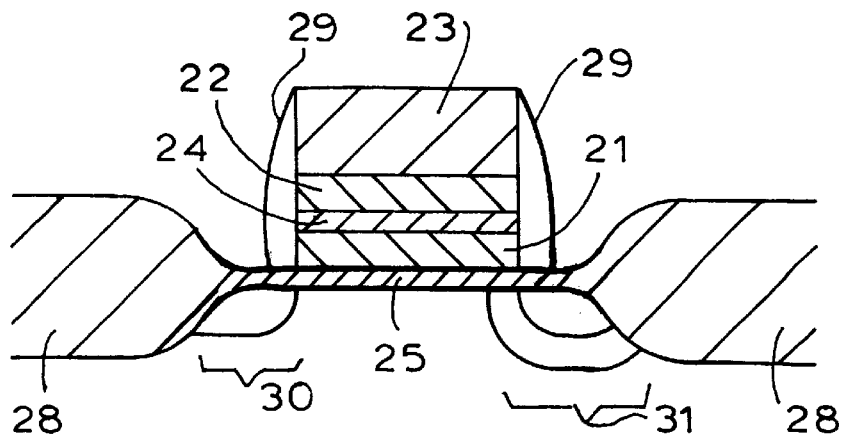
F I G. 4B

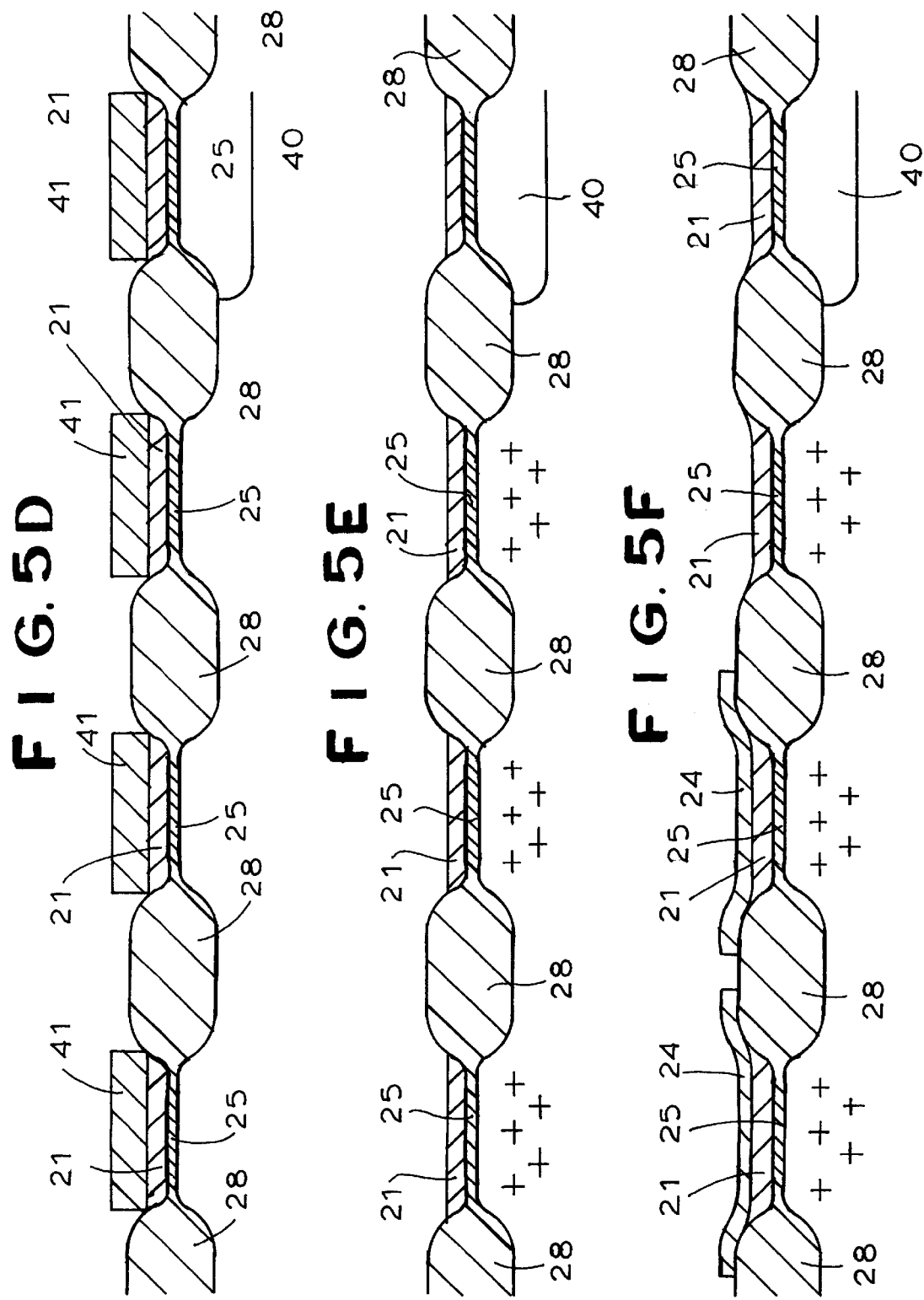

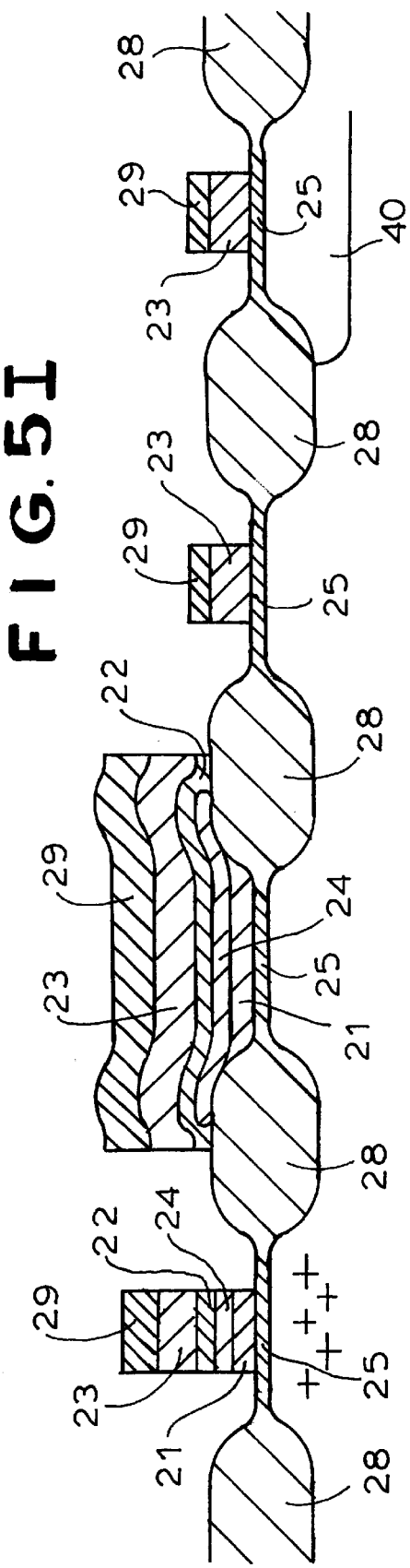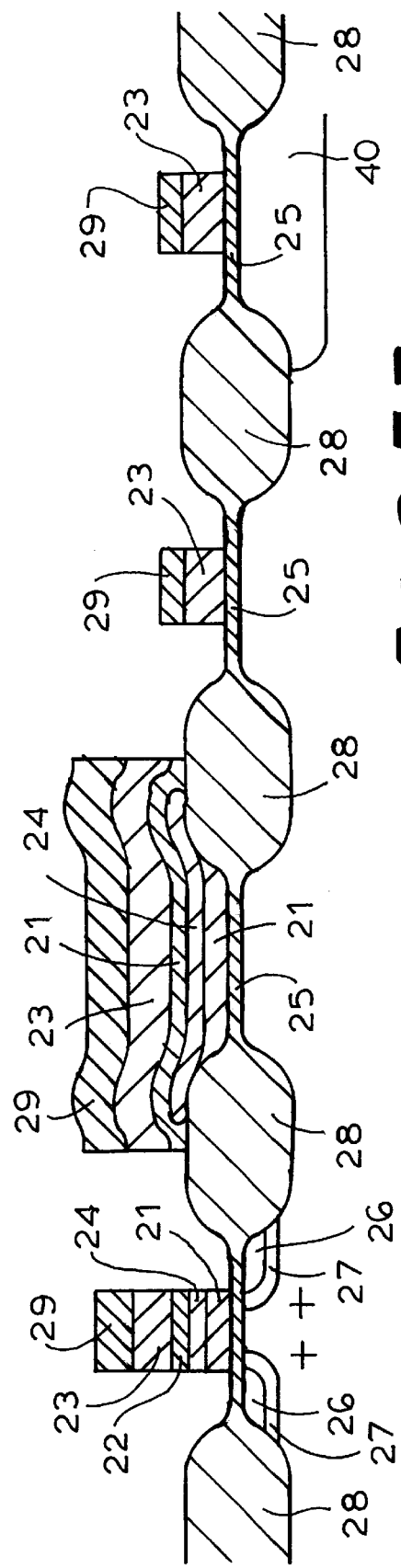

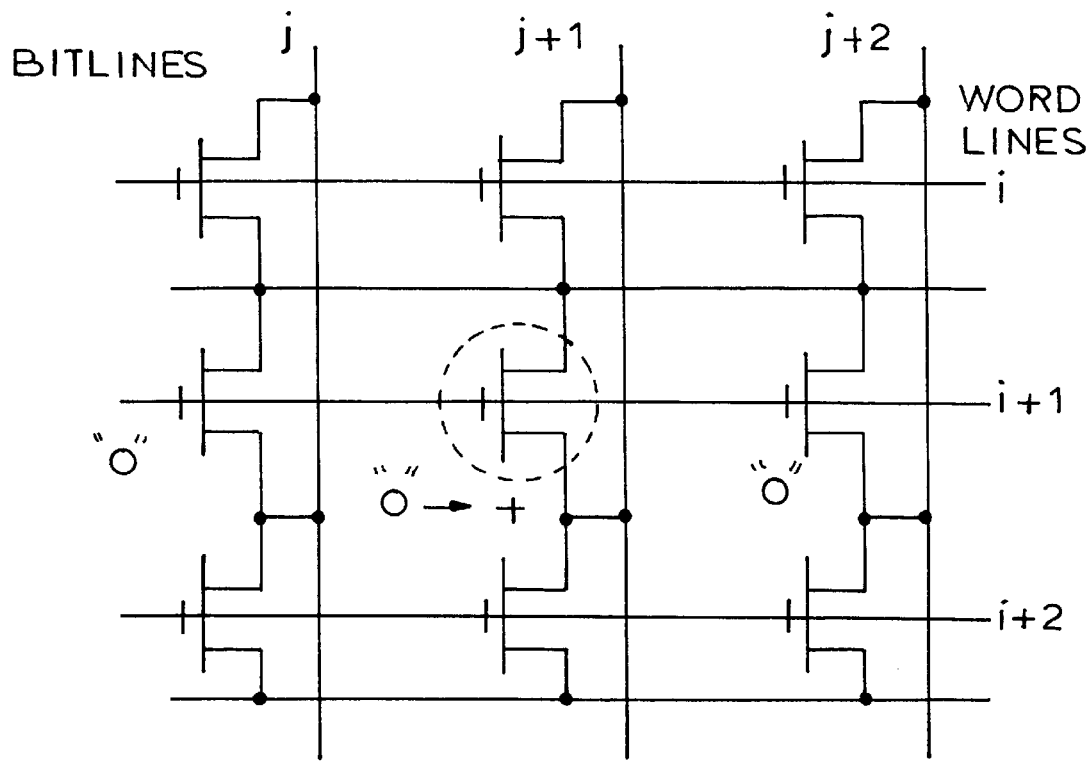
F I G. 6 C
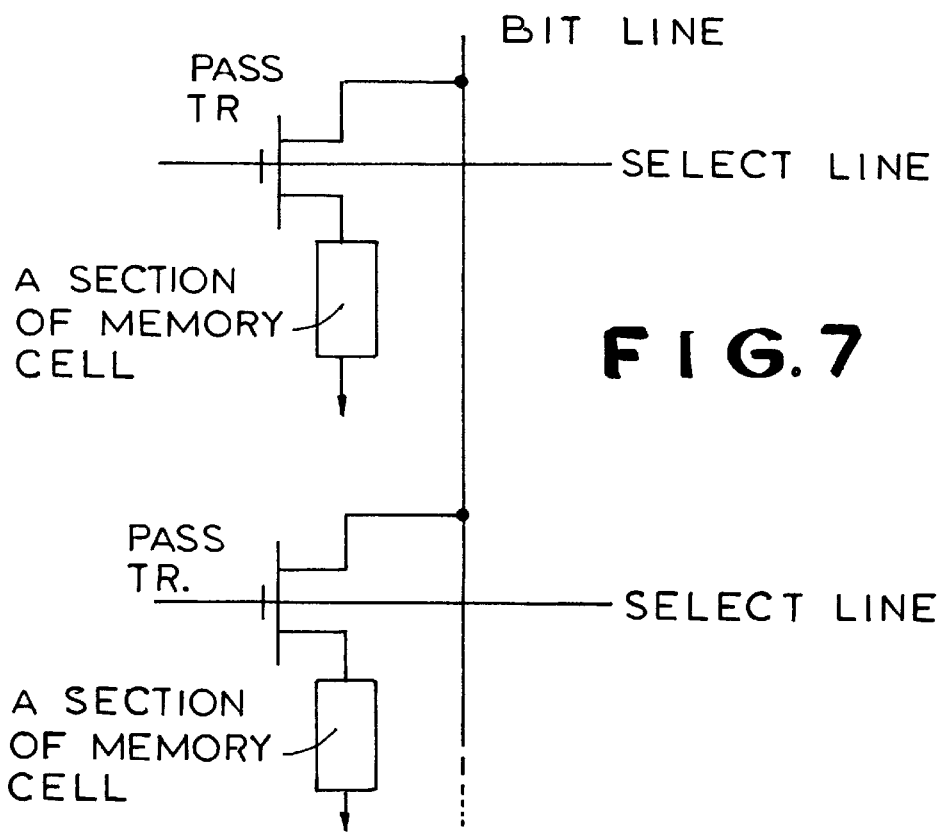
F I G. 7

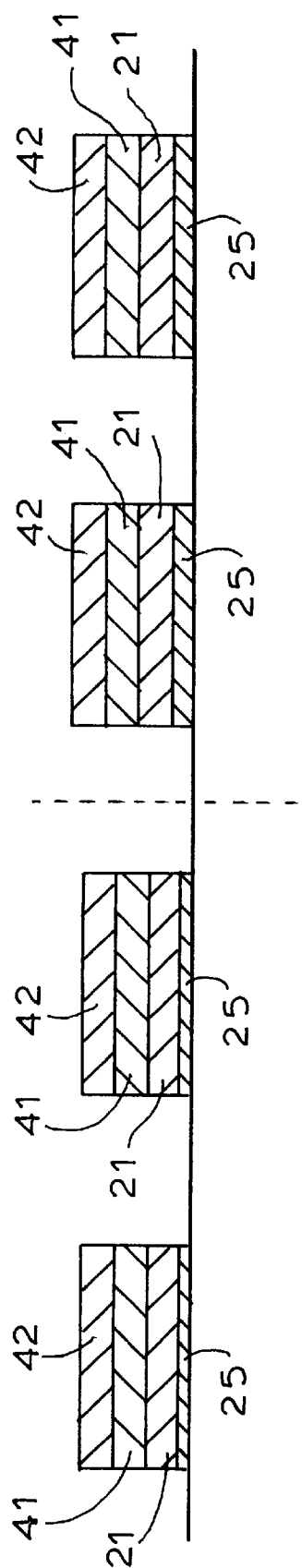
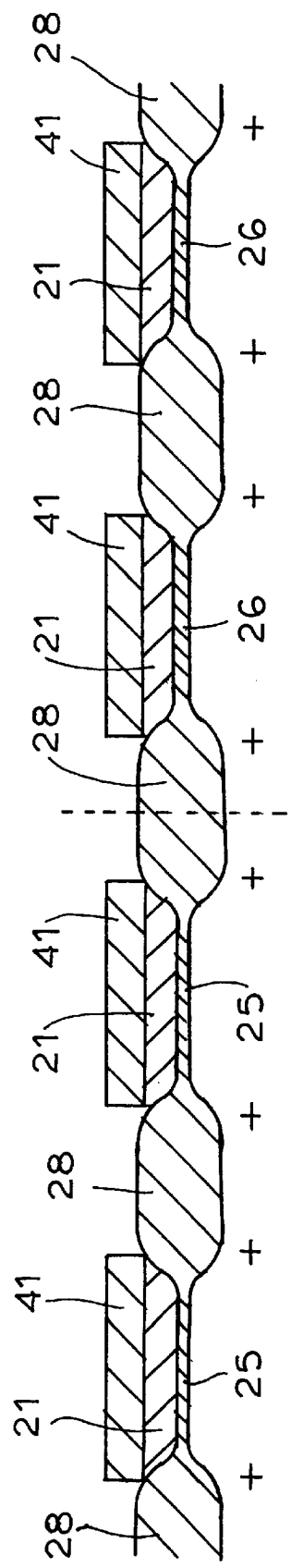
FIG.9C
FIG.9D

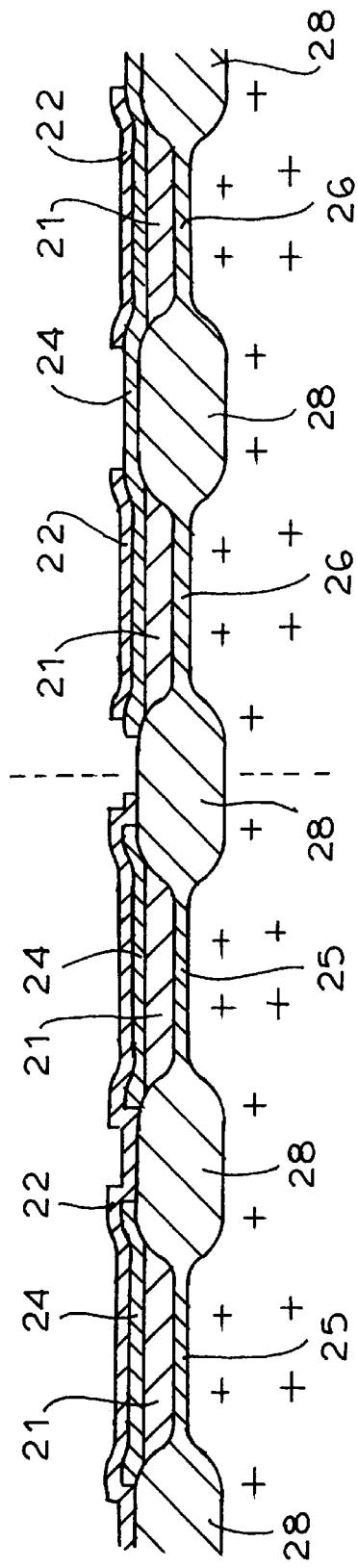
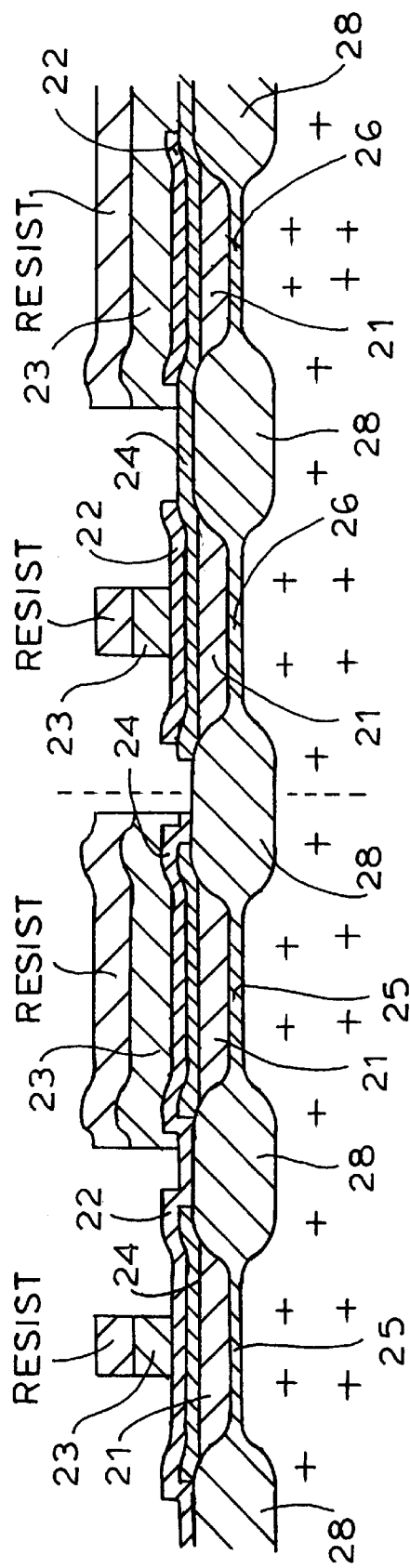
FIG. 9G
FIG. 9H

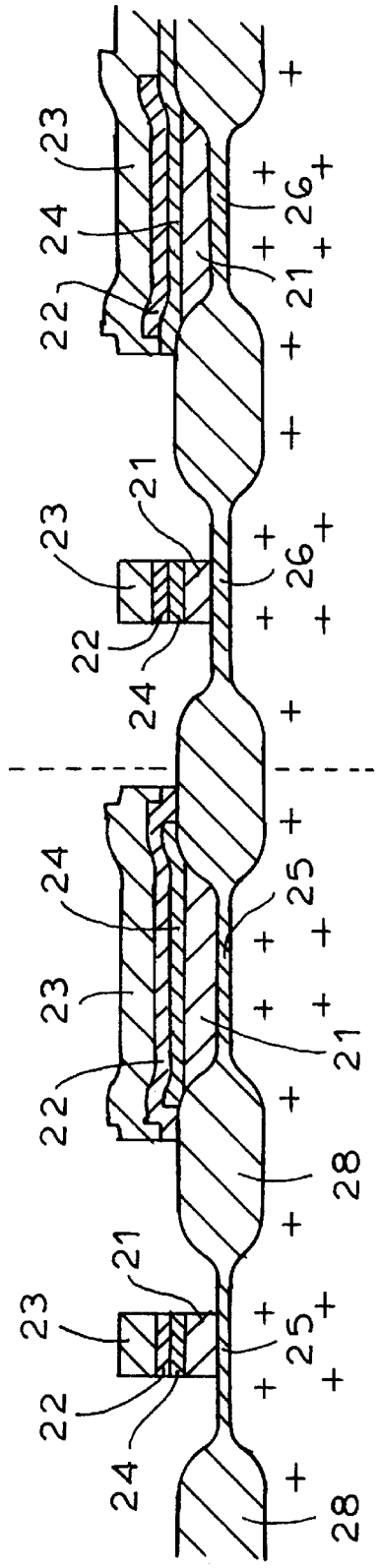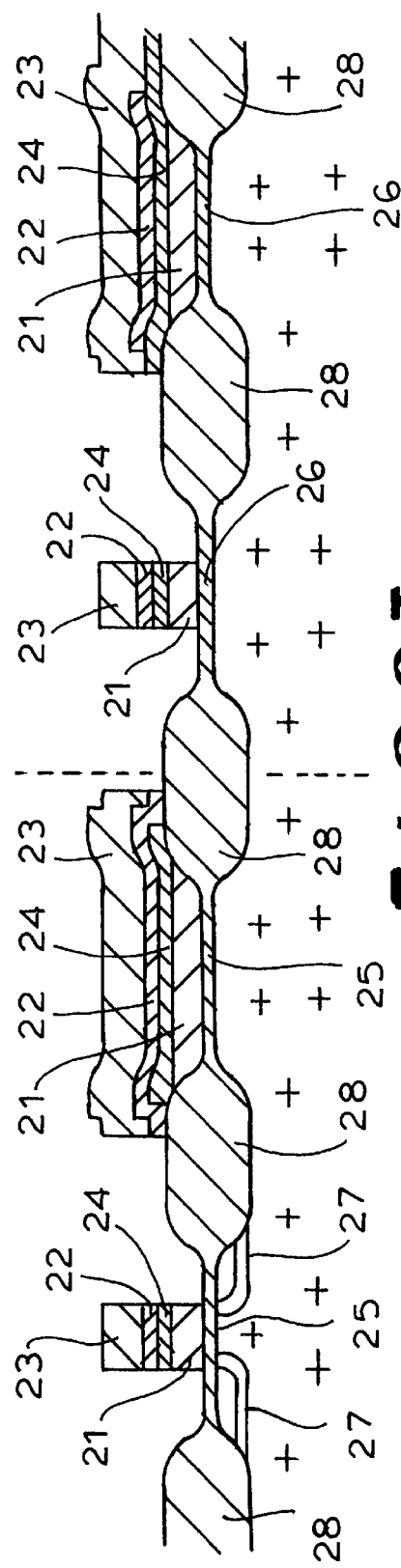

SINGLE TRANSISTOR E²PROM MEMORY DEVICE WITH CONTROLLED ERASING

CROSS REFERENCE TO RELATED APPLICATION

The patent application is a continuation of U.S. patent application Ser. No. 08/559,800 filed Nov. 17, 1995 now U.S. Pat. No. 5,773,861.

FIELD OF THE INVENTION

The invention relates generally to the fabrication and use of semiconductor memory devices. More specifically, a unique single transistor E²PROM profile is fabricated using an inventive process flow. Further, a novel memory array is provided which allows flash programming of memory cells sharing a common word line, and selective erasing of individual memory cells, via Fowler-Nordheim tunneling.

BACKGROUND OF THE INVENTION

In the semiconductor industry, non-volatile semiconductor memory is used to store critical programs and data essential for electronic systems, such as computers, telecommunications, industrial and medical instruments, etc. Non-volatile memories are categorized into different types depending upon the relevant technology, including: ROM (read-only memory) which is manufacturer programmed a single time; PROM (programmable read-only memory) which can be programmed by the customer a single time; EPROM (erasable programmable read-only memory) which can be customer programmed, UV-erased, and reprogrammed, generally fewer than one-hundred times, given the cumulative effects of UV exposures on the device arid on device reliability; E²PROM (electrically erasable programmable read only memory) which can be programmed and electrically erased by the customer anywhere from 1000–1,000,000 times.

So-called "flash memories" consist of implementations of E²PROM for high density manufacturing wherein the memory can be electrically erased in blocks or sectors, rather than at the byte level. FIG. 1 illustrates a memory array comprising a plurality of memory cells connected along word lines and bit lines. Blocks or sectors of the array may be defined, for example, such as all of the cells along a common source line. The flash memory technology can achieve high densities due to the smaller cell size realized in either a stacked gate or split/step gate cell profile, illustrated in FIGS. 2A and 2B, respectively. FIG. 2A shows a stacked gate memory cell profile having a floating gate, 11, and a control gate, 13, fabricated out of polycrystalline silicon doped with an appropriate doping material to render the polycrystalline silicon conductive ("poly 1" and "poly 2" respectively). The floating gate is electrically separated from the substrate region by an oxide layer of insulating material, 15. Depending upon the particular device, this intermediate oxide layer is designated as either the gate or tunnel oxide. Those familiar with the art will understand that for the specific purpose of detailing fabrication steps, each use of the term "tunnel oxide" hereinafter is intended to include both the tunnel and the related gate oxide, as appropriate. FIG. 2A further illustrates diffused source and drain regions, 17 and 19, which define a channel in the substrate. The floating gate and the control gate are separated by a layer of insulating material, 12, typically an interpoly layer of silicon dioxide. In operation, electrons are stored in a capacitive manner at the floating gate. Similarly, the split gate profile of FIG. 2B comprises floating polysilicon gate, 14, and control gate 16 ("poly 1" and "poly 2" respectively) separated by an interpoly dielectric.

The stacked gate profile has the obvious advantage of smaller dimensions, yet is prone to over-erasing whereby the cells readily become depletion-type memory devices when exposed to a negative threshold voltage. On the other hand, the split gate profile is superior in cell reliability, yet requires more surface area than the stacked gate cell. The cell reliability problems of the stacked gate profile are due to cell structure features inherently encountered in stacked gate profiles which have been fabricated in accordance with the current processing standards taught in the art. For example, the typical stacked gate cell structure shown in FIG. 3 illustrates two cell features, oxide thinning and edge leakage, which have deleterious effects on device reliability. The stacked gate structure of FIG. 3 is viewed in the word-line direction, perpendicular to the FIG. 2A perspective of the same structure viewed in the bit-line direction. Corresponding cell features are denoted with the same reference numerals in FIG. 3 as were used in FIG. 2A.

As noted with reference to FIG. 2A, the tunnel oxide layer 15 insulates the first polysilicon layer ("poly 1") from the substrate. Additionally illustrated in FIG. 3 are the field oxide regions, 18, which electrically isolate adjacent cells in the array from one another. Under standard processing as taught in the art, the field oxide regions are fabricated first and the tunnel oxide thereafter grown on the substrate between the field oxide regions. Due to the known geometric "bird's beak" effect and the Kooi effect, the so-called "white ribbon" effect, thinning of the layer of tunnel oxide is observed at the junction point between the tunnel oxide layer 15 and the field oxide regions 18. The thickness reduction due to the geometric effects is generally at least 10% to 15%, while addition of the Kooi effect thickness reduction can result in overall thickness reduction of between 20% and 30%. For advanced MOS devices, such as E²PROM or flash E²PROM memory devices wherein the gate oxide or tunnel oxide is in the range of ≦120 angstroms, 20%–30% oxide thickness reduction can introduce serious device reliability concerns due to a stronger electric field presence at the junction point between the tunnel oxide layer and the field oxide regions.

Further reliability concerns due to current leakage are observed at the edges of those portions of poly 1 layer 11 which overlap each of the field oxide regions, 18. Since the poly 1 layer is conformally deposited to create the floating gate structure, a relatively thick layer of poly 1 overlays the field oxide regions. In addition, when the optimal poly 1 layer thickness, in the range of 1000–2500 angstroms, is used, the overlaying portions of the poly 1 layer tend to have sharp edges or corners. These abrupt edges become apparent after the interpoly layer has been formed over the poly 1 layer via a standard, relatively low temperature (below 1050° C.), oxidation step. The sharp edges, or asperities, induce excessive leakage of current between the poly 1 and poly 2 layers, necessarily having a negative impact on device reliability.

It is, therefore, an objective of the present invention to fabricate a high density array of stacked gate memory cells which are not subject to the aforementioned cell reliability concerns.

It is a further objective of the invention to provide a memory array architecture and programming capability whereby individual cells can be erased with the attendant benefit of attaining reliable, programmable, multi-valued logic.

SUMMARY OF THE INVENTION

These and other objectives are realized by the present invention wherein a memory cell having a novel stacked gate cell profile is fabricated in accordance with an inventive process flow.

The device profile has a tunnel oxide formed on a substrate with field oxide regions formed to connect with the tunnel oxide layer edges. No thinning of the edges of the tunnel oxide is observed when the field oxide regions are formed subsequent to the tunnel oxide formation. A first gate, or floating gate, comprises two layers of polysilicon, or analogous material, the first layer deposited over the tunnel oxide between the field oxide regions and the second layer having edges which overlay the field oxide regions. The overlaying floating gate material is thinner than previously achieved in the art and exhibits smooth edges under subsequent processing. Interpoly dielectric material is deposited over the floating gate and the gate profile completed with the fabrication of a control gate over the interpoly dielectric. Source and drain regions are formed in the substrate, in either symmetrical or asymmetrical relationship, beneath the stacked gate.

The unique programming of the inventive structure in a memory array comprises flash programming along a selected word line with selective erasing by application of the appropriate voltage along the bit line which intersects the selected word line at the byte address of a selected memory cell.

BRIEF DESCRIPTION OF THE DRAWINGS

The details of the inventive structure, array and process flow will now be described with specific reference to the drawings wherein:

FIGS. 4A and 4B illustrate the inventive stacked gate memory cell device, viewed along the word-line and the bit-line, respectively.

FIGS. 5A through 5J show the process flow by which the inventive memory cell structure is fabricated.

FIGS. 6A through 6C illustrate the byte level memory cell programming and erasing functions achieved in accordance with the present invention.

FIG. 7 illustrates the partition of the memory array into smaller sectors or blocks.

FIG. 9A through 9J provide an alternative process flow to facilitate peripheral device formation simultaneously with memory cell fabrication.

DETAILED DESCRIPTION OF THE PREFERRED EMBODIMENT

Figure 1:
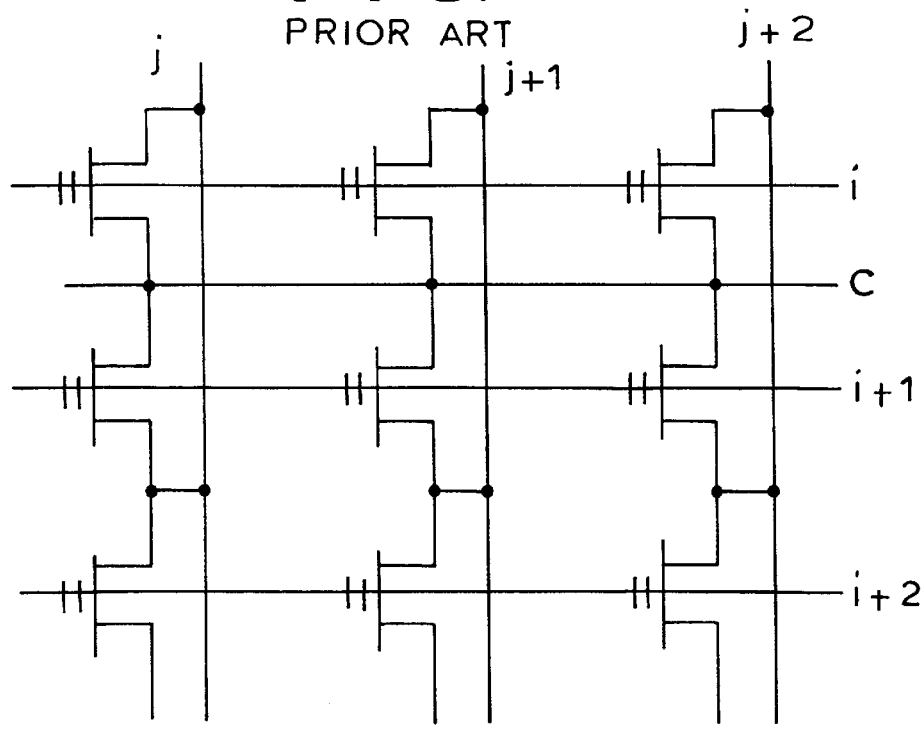
FIG. 1 shows a segment of a multi-cell memory array.
Figure 2A:
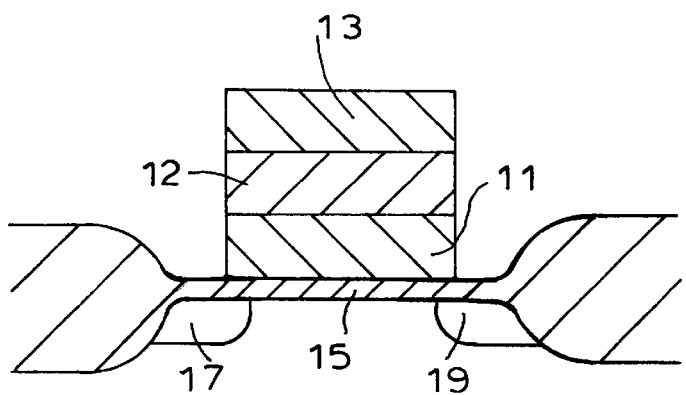
FIGS. 2A and 2B illustrate the standard stacked gate and split gate profiles for memory cells, viewed along the bit-line perspective, in accordance with presently available technology.
Figure 2B:
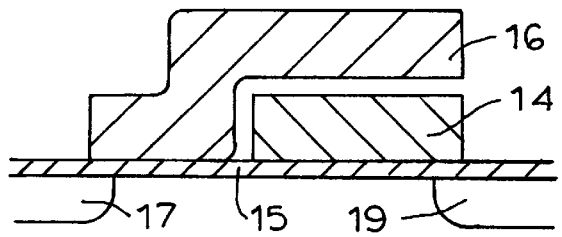
Figure 3:
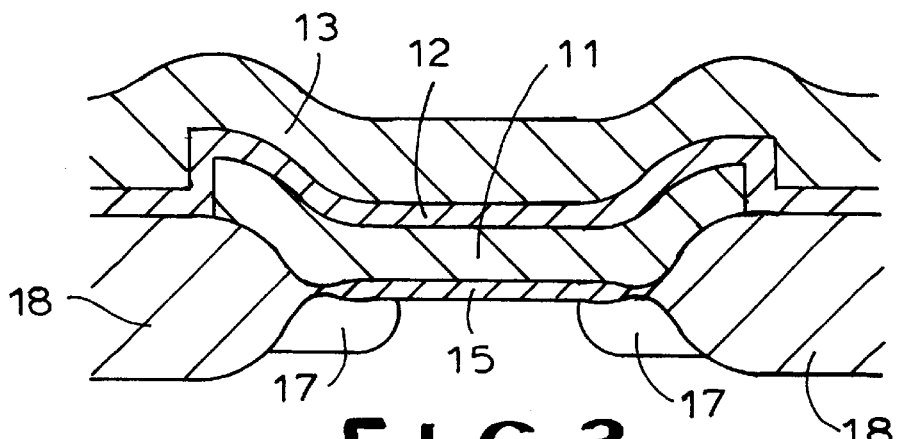
FIG. 3 provides a word-line view of a stacked gate memory cell in accordance with known technology.

A stacked gate memory cell fabricated in accordance with the present invention, as illustrated in FIGS. 4A and 4B, includes a control gate 23 comprising a poly 2 layer, an interpoly dielectric layer 22, and a floating gate of poly 1 which comprises two layers 21 and 24, wherein only the thin second layer of the poly 1 layers, 24, with its "rounded edges", overlays the field oxide regions 28. The tunnel oxide layer 25, located between the floating gate and the substrate, and connected to the oxide of the field oxide regions 28, exhibits no thinning where it connects to the field oxide regions. Source region 30 comprises one area of the P-type silicon substrate into which a first dopant 26 (e.g., arsenic) has been introduced, while the drain region 31 comprises the substrate area into which both the first dopant 26 and a second dopant 27 (e.g., arsenic and phosphor, respectively) have been driven. Those familiar with the art will recognize that various dopants, combinations of dopants, and dopant concentrations can be effectively utilized in symmetric or asymmetric manner for the source and drain regions. The word-line perspective of 4A has only the drain region doping illustrated whereas FIG. 4B additionally shows an oxide spacer coating, 29, not shown in the FIG. 4A perspective.

The fabrication of the inventive memory cell, which is not susceptive of the specific reliability defects found in the prior art, will now be detailed with reference to FIGS. 5A through 5J. As will be apparent to one having skill in the art, fabrication of a memory array includes not only the stacked gate formation for each individual cell, but also the effectively simultaneous formation of related peripheral devices in the same substrate, including but not limited to the formation of N-MOS and P-MOS transistors. In addition, the process flow can be utilized for the fabrication of EPROM memory devices, with such modifications as will be apparent to one having skill in the art. The illustrated process flow provides, therefore, the resulting structure illustrated at 5J, wherein the following are fabricated in and on a portion of the substrate: a first memory cell having its cross-section along the bit-line, an adjacent second memory cell having its cross-section along the word-line, an N-MOS logic device, and a P-MOS logic device. The invention is first being described with the peripheral devices formed in accordance with N-well C-MOS technology, which has been chosen for illustrative purposes, only. Clearly, the authors hereof do not wish to be limited to the inventive fabrication of the inventive memory devices and array solely in conjunction with the fabrication of the specifically illustrated peripheral devices; but include the description and processing of the peripherals in order to most illustratively provide a complete and functional description of representative embodiments of the invention.

Figure 5A:

FIG. 5A illustrates the substrate, 20, upon completion of the formation of the N-well region, 40, in accordance with known technology. As noted above, the substrate is a P-type silicon, which to-date evidences the most favorable attributes for both fabrication and operation of the subject memory cells and array. At FIG. 5B, formation of the tunnel oxide, 25, is conducted to obtain a 6–12 nm layer of tunnel dielectric on the substrate 20. For the P-type silicon substrate of the present embodiment, the tunnel dielectric is a layer of silicon dioxide which may be formed by the exposure of the surface of the silicon substrate to an oxidizing atmosphere in accordance with known processing conditions, such as thermal oxidation in a dry $O_2$ ambient at 900–1070° C. for 20–50 minutes.

Figure 5B:
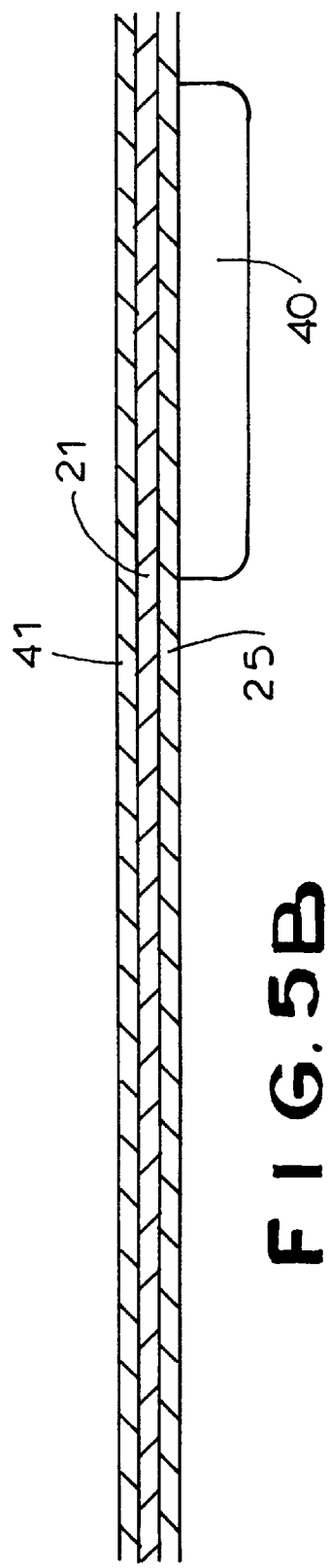
Figure 5C:
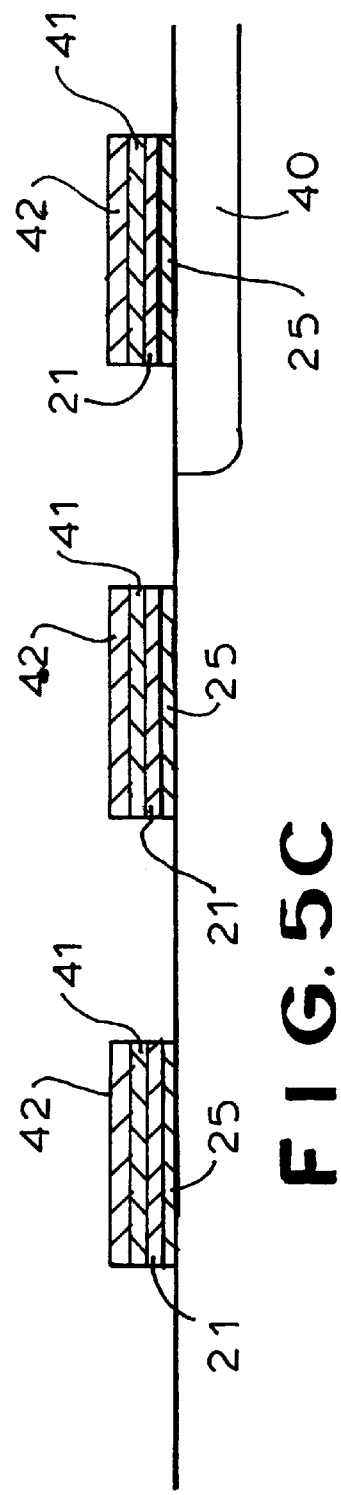

Next, also illustrated on FIG. 5B, a co-extensive layer of amorphous silicon is deposited over the tunnel dielectric. This amorphous silicon will serve as the first poly 1 layer, 21, as will be further detailed below. The amorphous silicon layer, having a thickness in the range of 50–150 nm, is formed, for example, by low pressure chemical vapor deposition (LPCVD) at 550° C. Polysilicon can alternatively be deposited for the poly 1 layer by LPCVD at 620° C.; however, the amorphorous silicon is presently preferred due to its superior planarity.

LPCVD is next done to deposit a 100–200 nm co-extensive layer of nitride, 41, over the amorphous silicon. A photoresist material, 42, is deposited and patterned over the nitride layer, in accordance with known processing steps, and the nitride, amorphous silicon and dielectric removed from all areas which will not serve as active regions. The resulting structure is found in FIG. 5C, wherein the substrate surface has been selectively exposed in the "non-active" regions. After dry etching of the nitride, amorphous silicon and dielectric, the patterned resist 42 is removed from the nitride surface. It is to be noted that the dielectric can be left in place, with only the nitride and silicon removed at this stage of processing.

The substrate structure is next exposed to another oxidation step, preferably by thermal oxidation at 900–1100° C. using a dry-wet-dry process, whereby all of the exposed, "non-active", regions of the substrate are oxidized. The field oxide regions, 28, which are formed by this oxidation step will I1s electrically insulate all of the active regions and devices from one another. As can be realized from FIG. 5D, the upper surface of the field oxide regions extend above the level at which the surface of the substrate had been found, since the oxidation step provides for growth of oxide on the substrate surface, 300–400 nm above the surface, as well as oxidation into the substrate to depths of 200–500 nm, whereby roughly half of the total thickness of the field oxide is found above the surface. The height of the upper surfaces of the field oxide regions is optimized whereby the upper surfaces extend beyond the level of the upper surface of the amorphous silicon. As noted above, the inventive structure does not suffer from the deleterious thinning of the tunnel oxide at the junctures of the tunnel oxide layers and the field oxide regions. Thinning is avoided due to the fact that the field oxide is grown after the formation of the tunnel oxide, contrary to the order in which the prior art fabrication processes have progressed.

After the field oxide regions have been formed, the nitride is stripped off to expose the amorphous silicon in the active regions. The next step, at 5E, comprises the cell threshold implant for doping of the silicon substrate. A preferable process comprises implanting boron into the silicon using an implant energy of 50–150 kev. This is conducted through the amorphous silicon and tunnel dielectric. The field oxide regions will block the boron in certain areas; moreover, the N-MOS and P-MOS areas may be screened, so that regions of the substrate are selectively doped.

A second thin 30–70 nm layer of amorphous silicon is next conformally deposited over the entire structure, after which selective doping is performed in order to render the amorphous silicon layers conductive. An arsenic implant, providing $1 \times 10^{15}/cm^2$ to $5 \times 10^{15}/cm^2$ of arsenic implant dosage to layers 21 and 24, can be conducted at between 30 and 50 kev. One having skill in the art will recognize that the implant energy will be optimized to assure, first, that the relevant layers are sufficiently doped to become conductive and second, that the arsenic (or other dopant) remains in the poly 1 layers.

Layer 24 is selectively etched to partially define the floating gates of the memory cells. Etching of the doped silicon is conducted by a dry etch process through a photoresist mask, whereby layer 24 is removed from all areas other than the memory cell regions. Over the field oxide regions which isolate the memory cells, edges of the patterned layer 24 overlap the field oxide. Over the field oxide which isolates two adjacent memory cells, the field oxide is exposed, via etching of an opening or channel 42 in layer 24, which opening will be filled in the next succeeding step. As illustrated in FIG. 5F, layers 21 and 24 together comprise the poly 1 floating gate of the stacked gate memory cell.

Figure 5G:
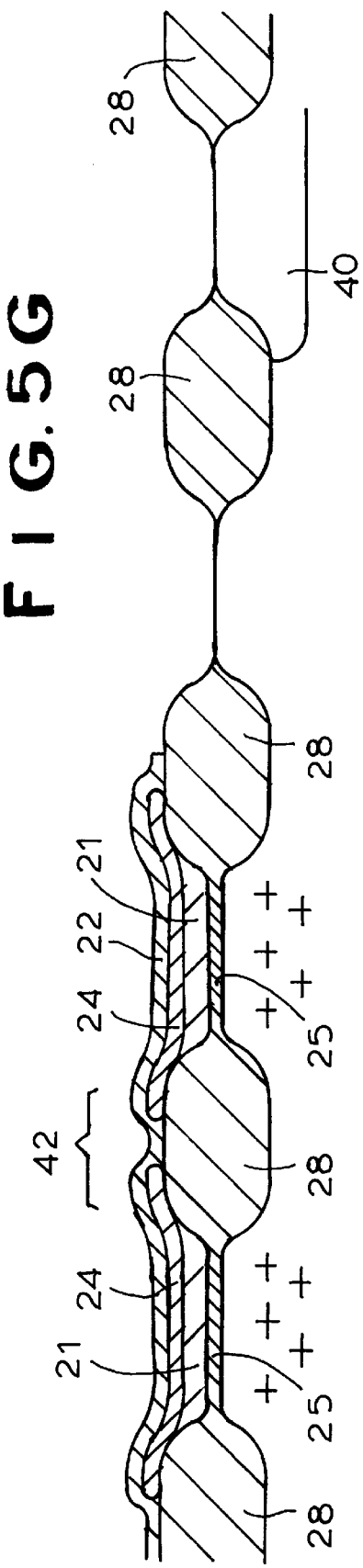

The interpoly dielectric layer, 22 of FIG. 5G, of a poly oxide or, as illustrated, oxide-nitride-oxide (ONO) is formed. A preferred process comprises a 1000–1100° C. dry $O_2$ thermal oxidation to a thickness of 5–20 nm, followed by LPCVD nitride deposition of 10–25 nm at 750–790° C., and finally, a 900–1000° C. thermal oxidation in a wet $O_2$ ambient to grow a 2–6 nm oxide layer on top of the nitride layer. The ONO is formed over the poly 1 layer, filling opening 42 over the field oxide region, and thereby completely isolating the poly 1 layer to eliminate the possibility of leakage of charge at the poly 1 edge. In addition, in the formation of the ONO interpoly dielectric, the edges of patterned layer 24 become rounded due to the fact that oxidation can occur from all directions along the edges of layer 24 over the field oxide, since layer 24 is relatively thin. The rounding of edges of the thin poly 1 overlayer provides the aforementioned advantage of reduction of leakage, which had been encountered in the prior art due to sharp edges of a thick poly 1 layer underlaying the interpoly dielectric layer.

As can be observed in FIG. 5G, after formation of the ONO layer, a resist layer is applied and patterned and the ONO removed from all surfaces other than the memory cell locations. Further, the remaining poly 1 layers are removed from the regions designated for peripheral device formation. Once the peripheral device regions have been exposed, gate oxidation can be conducted in accordance with known methods, with the gate oxidation penetrating the substrate generally to a depth of 15–35 nm in the relevant substrate regions, while all other regions are effectively insulated from this step by the ONO layer.

Figure 5H:
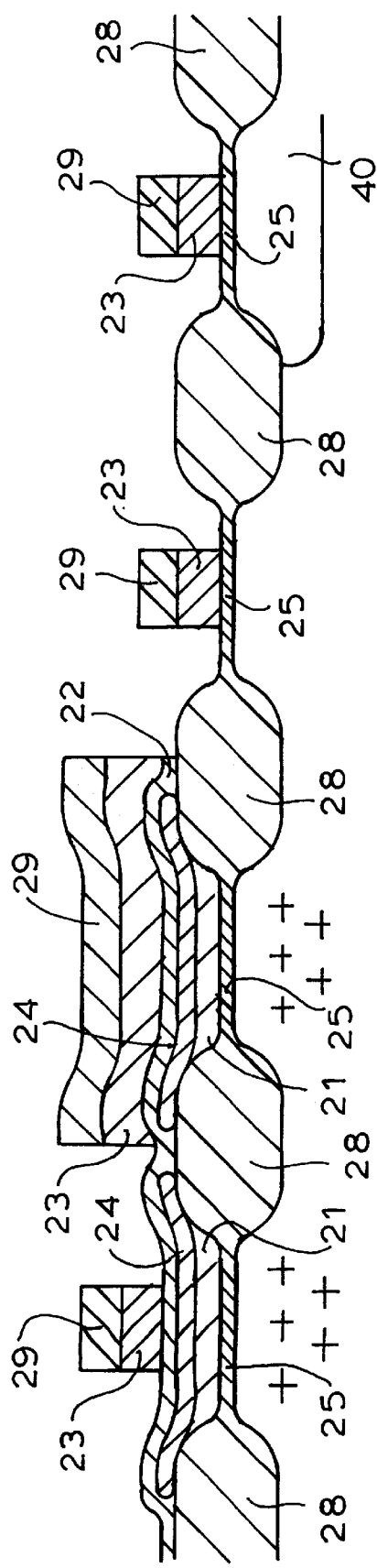

A conformal layer, 23, of either amorphous silicon or polysilicon is next deposited over the entire structure, covering both the memory cell regions and the peripheral device regions. The poly 2 layer of polysilicon or amorphous silicon for the control gate can be deposited by LPCVD to a layer thickness of 250–400 nm, followed by doping of the poly 2 by arsenic or phosphor ion implant or diffusion. The next step is deposition of an oxide layer of 100–150 nm. A resist mask is formed and the oxide and poly 2 layers, 29 and 23, etched by dry etch, sequentially etching the materials to define the N-MOS, P-MOS and memory devices, as illustrated in FIG. 5H. Another resist mask is then utilized over the peripheral transistors and, using the poly 2 as a self-aligning etching mask, the ONO and poly 1 layers, 22, 24 and 21, are removed in the designated memory areas, as illustrated in FIG. 5I.

As a final step in the stacked gate memory cell fabrication process, cell source and drain implants are provided to the substrate in the appropriate regions associated with the memory devices. Peripheral devices are masked from the implant step, which mask can be the same as was in place from the previous step. The resulting structure, as illustrated in FIG. 5J, includes implant regions 27 and 26, for example, of phosphor and arsenic, which form the source and drain regions for the symmetrical memory cells. As will be apparent to one having skill in the art and as noted above, the source and drain implants can be other than the arsenic and phosphor combination detailed herein. For instance, the memory cell shown in FIG. 4B has an asymmetrical cell source, region 30 with arsenic only, and cell drain, region 31 with arsenic and phosphor, profile. One will next proceed to complete the overall structure, including the N-MOS and P-MOS devices and interconnects, using the standard C-MOS process technology, which is not a part of the present invention.

Figure 8:
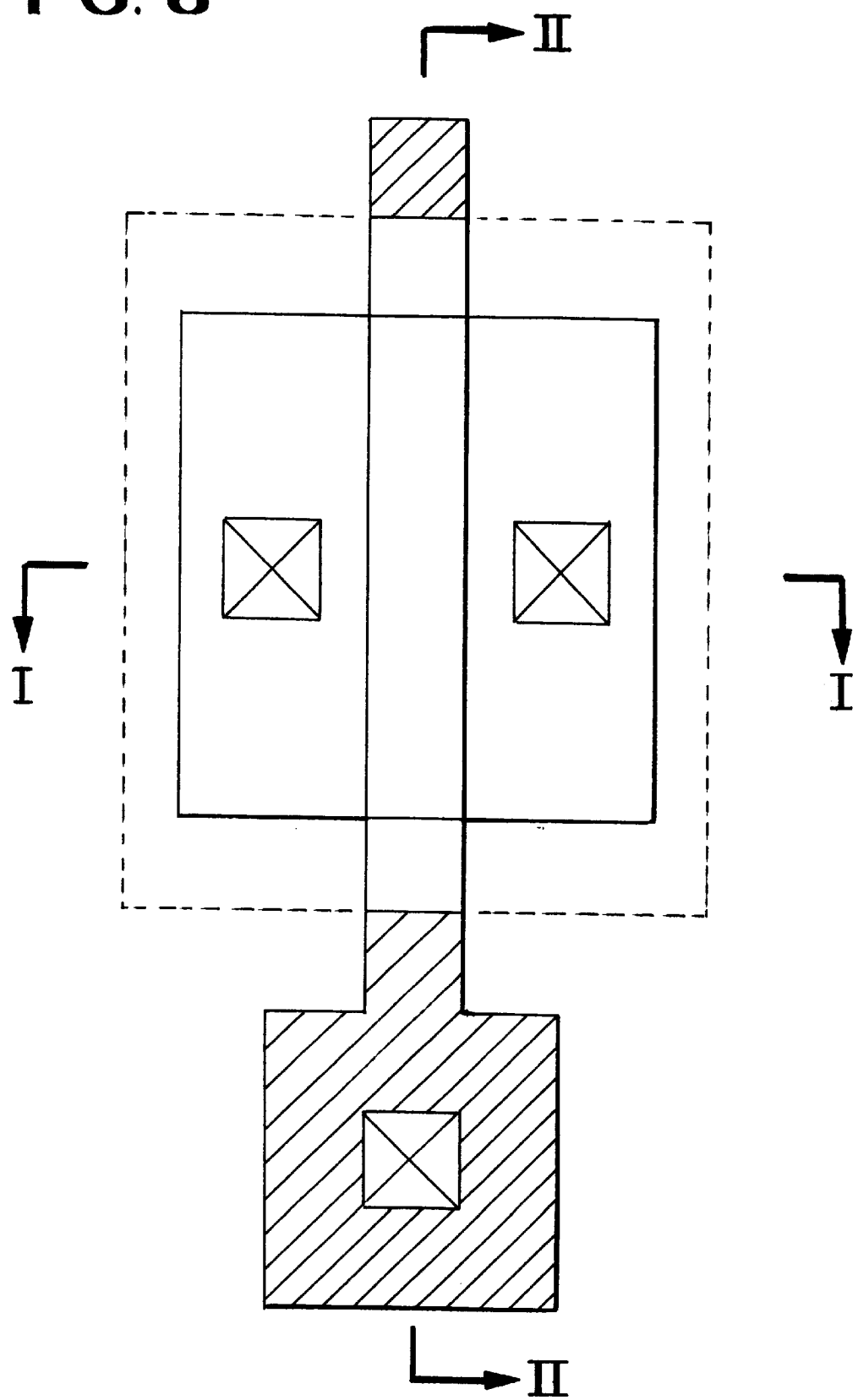
FIG. 8 is the typical layout for peripheral devices simultaneously formed in accordance with one embodiment of this disclosure.

As an alternative, the process flow can be streamlined to facilitate peripheral device fabrication simultaneous with the E$^2$PROM or EPROM fabrication in the same substrate. FIG. 8 illustrates a representative E$^2$PROM peripheral device layout in accordance with the invention. The device cross-sectional views, along I—I and II—II, are shown in FIGS. 9A–9J at various processing steps, wherein cross-section I—I shows the peripheral device structure along the source-drain direction and cross-section II—II shows the peripheral device structure along the polysilicon gate direction.

FIGS. 9A–9J illustrate a varied process flow whereby peripheral devices are fabricated simultaneously with the memory device fabrication. Wherever the processing and materials are the same as previously described with reference to FIGS. 5A–5J, like reference numerals are used and repetition of detailed description is omitted. For the first is step, FIG. 9A parallels FIG. 5A at which the N-well region 40 has been created in substrate 20. Subsequently, as detailed with reference to FIG. 5B, a uniform layer, 25, of oxide is formed on the substrate surface to act as the gate oxide. For E$^2$PROM-type devices, the thickness of the gate or tunnel oxide 25 for the memory devices is different from the thickness of the gate oxide 26 needed for the peripheral devices. Therefore, in E$^2$PROM applications, a first portion of gate oxide, about 10 nm–25 nm thick, is grown over the entire substrate and a conventional resist mask is used to remove the first portion of gate oxide from the memory device area.

The resist is then stripped from the substrate and another second gate oxide layer, 25, is grown to a gate oxide thickness in the range of 6–12 nm for the memory device. Simultaneously, during this oxidation, the thickness of the gate oxide over the peripheral device region will reach a final thickness in the range of 15–35 nm, as evidenced by the stepped profile illustrated in FIG. 9B.

For EPROM or OTP (one-time program EPROM) devices, the thickness of the gate oxide for the memory devices may be the same as for the peripheral devices. In that case, a uniformly grown gate oxide, such as was shown in FIG. 5B, is grown in a single step to a thickness range of 10–30 nm. To simplify the process description, hereinafter only the E$^2$PROM devices and peripheral N-MOS transistors will be described with further reference to FIGS. 9B–9J.

Figure 9A:
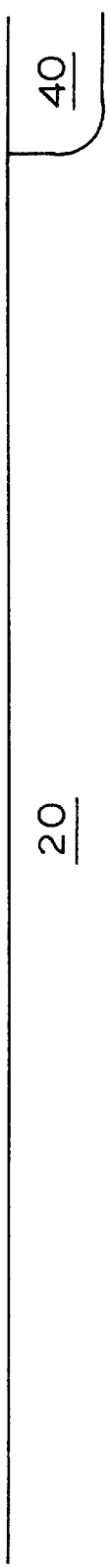
Figure 9B:
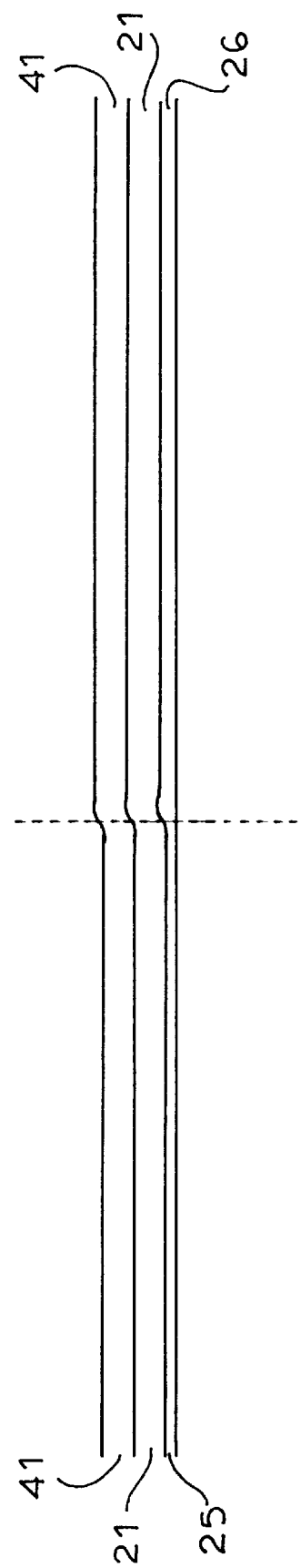
Figure 9E:
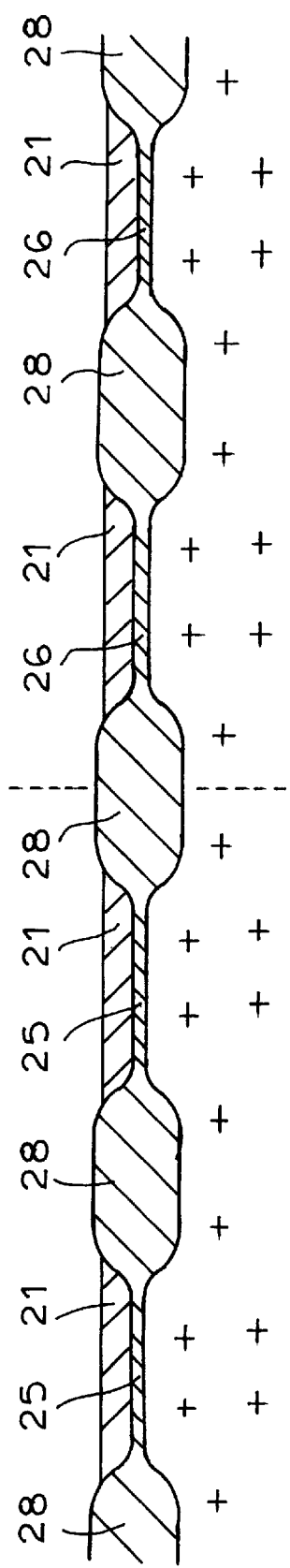

After the gate oxide 25 is formed, an amorphous silicon layer, 21, and LPCVD nitride layer 41 are sequentially deposited over the substrate as shown in FIG. 9B. Thereafter, the processing illustrated in FIGS. 9C to 9E parallels that described with reference to FIGS. 5C through 5E and does not require repeating.

Figure 9F:
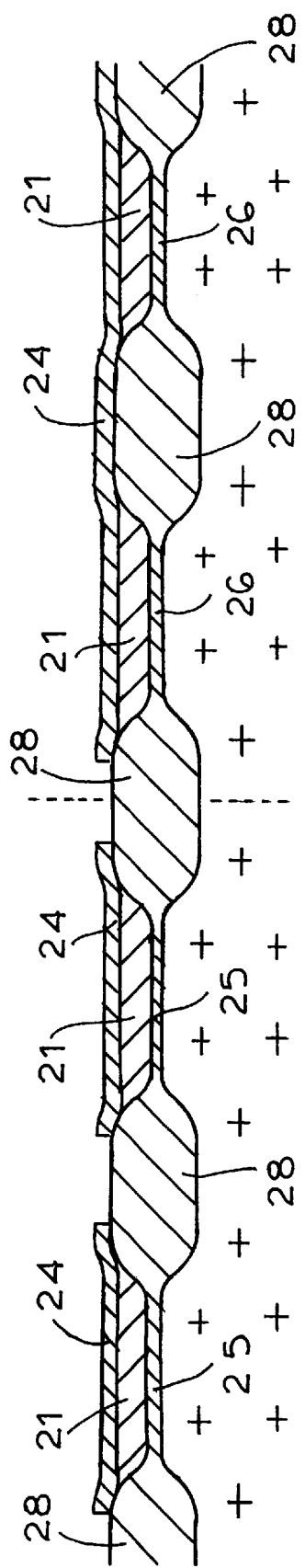

At FIG. 9F, the processing differs from that detailed with reference to FIG. 5F. A thin layer of poly 1, 24, at a thickness of 30–70 nm, is conformally deposited over the structure of FIG. 9E. A resist mask is then applied to define the thin, 30–70 nm, layer of poly 1 and selectively removed by dry etching. This differs from the step at FIG. 5F, since a thin layer of poly 1 remains over the peripheral device region of FIG. 9F. At FIG. 9G, an interpoly layer of poly oxide, or ONO (as illustrated) is formed and a resist mask is applied to selectively remove the ONO layer from certain regions via a dry etch step. FIG. 9G shows the ONO layer 22 essentially covering the diffusion region of the peripheral devices.

In FIG. 9H, unlike its counterpart FIG. 5H, there is no oxide deposition required (i.e., layer 29) in this process flow. The resist mask is applied directly on the top of the doped poly 2 layer. The same resist mask described in FIG. 9H is used to continuously etch the ONO and poly 1 layers for both the memory and the peripheral devices as shown in FIG. 9J, thereby simplifying the process flow.

Finally, FIG. 9J shows the device structure after the implantation step for formation of the source and drain of the memory devices. Standard C-MOS processing is then conducted in accordance with known technology to complete the peripheral device fabrication.

The advantages of the later-recited process flow include a simplified process technology for non-volatile memory device manufacturing, flexibility for both EPROM and E$^2$PROM device fabrication, and economic feasibility to fabricate both EPROM and E$^2$PROM on the same substrate.

The inventive stacked gate memory cell operates in accordance with the Fowler-Nordheim (F-N) tunneling mechanism, and will now be described with reference to the structure as illustrated in FIG. 4B. For cell programming, i.e., providing electrons for storage at the floating gate of the memory cell, electrons are injected from the cell's channel region, as defined by source and drain regions 30 and 31, into the floating gate, poly 1 comprised of layers 21 and 24, above the cell channel, by tunneling across the thin tunneling dielectric 25. In order to inject electrons into the floating gate from the channel region, a high voltage is applied to poly 2 layer 23 while the substrate 20 is maintained either at ground or at negative bias, and the cell source and cell drain, 30 and 31, are left floating or at ground. The high voltage applied to poly 2 is capacitively coupled to the floating gate, poly 1, so that a high electric field is present which induces the F-N tunneling mechanism. In order to be efficient for F-N tunneling, the thickness of the tunneling dielectric is kept below 10 nm, as noted in the above fabrication process flow.

To perform a cell erase operation, the stored electrons must be removed from the floating gate, poly 1, to the underlaying drain region, 31, utilizing a reverse F-N tunneling function. In principle, the cell could also be erased to the cell source region, which is beneficial if a block or array erase is desired. For the presently described process, however, it is desirable to implement a byte erase mode and to provide multi-valued logic states on the memory cell. Therefore, erasing through the cell drain is preferable. In order to remove electrons from the floating gate to the cell drain, a high voltage (i.e., higher than the voltage on the poly 2 layer, 23) must be applied to the cell drain region, to establish an electric field across tunneling dielectric 25 between the floating gate, comprised of 24 and 21, and the cell drain, 31. During the cell erase operation, the substrate, 20, is maintained at ground potential while the cell source region, 30, is left floating.

The above-described memory cell programming and erase capabilities can be implemented in a memory array such as is found in FIG. 1, as detailed with reference to the illustrations found in FIGS. 6A–6C. The memory array of FIGS. 1 and 6A–6C consists of a plurality of memory cells wherein all of the cell drains in the same column are connected together by a bit-line, j, j+1, etc.; all of the poly 2 gates in the same row are connected together by a word-line, i, i+1, etc.; and, the cell sources are connected by a common line, c. The bit-lines and word-lines are also connected to address decoder circuitries to determine the location of the memory cell in the array. The bit-lines are further connected to sense amplifier or equivalent circuitry for reading the cell information from the selected memory cells. The memory array is initially in a virgin state such that there are no extra charges in the floating gates for any of the memory cells in the array. The memory can contain information required by performing the programming operations detailed with reference to FIGS. 6A and 6B as follows.

Figure 6A:
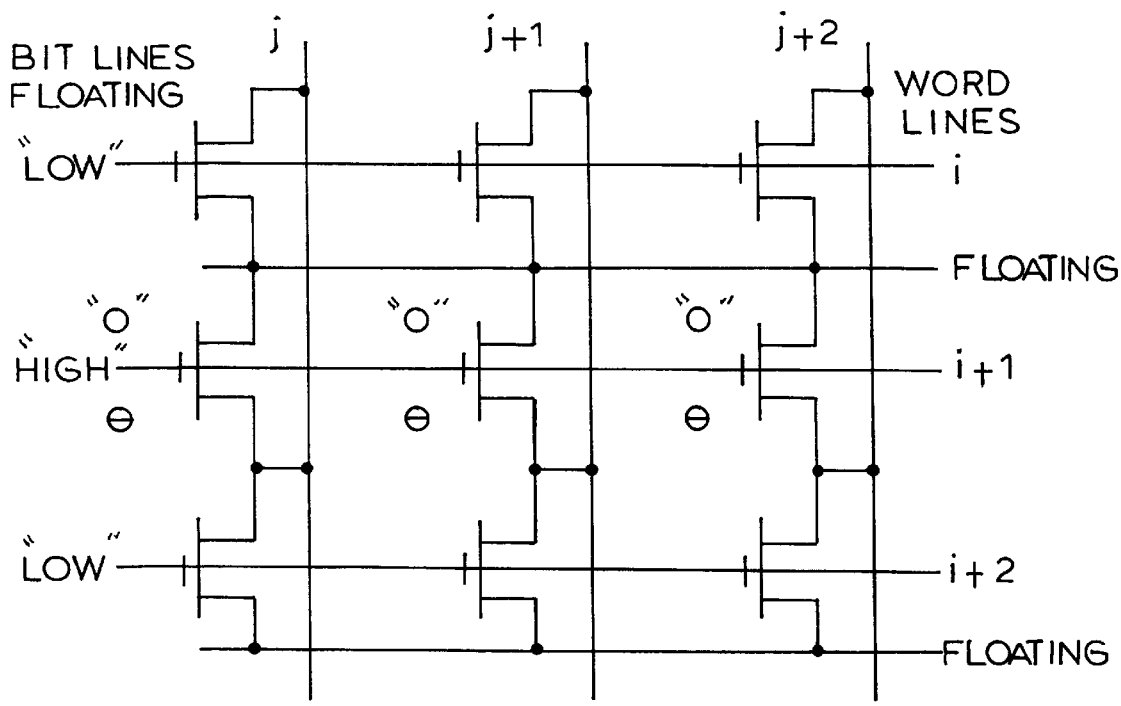
Figure 6B:
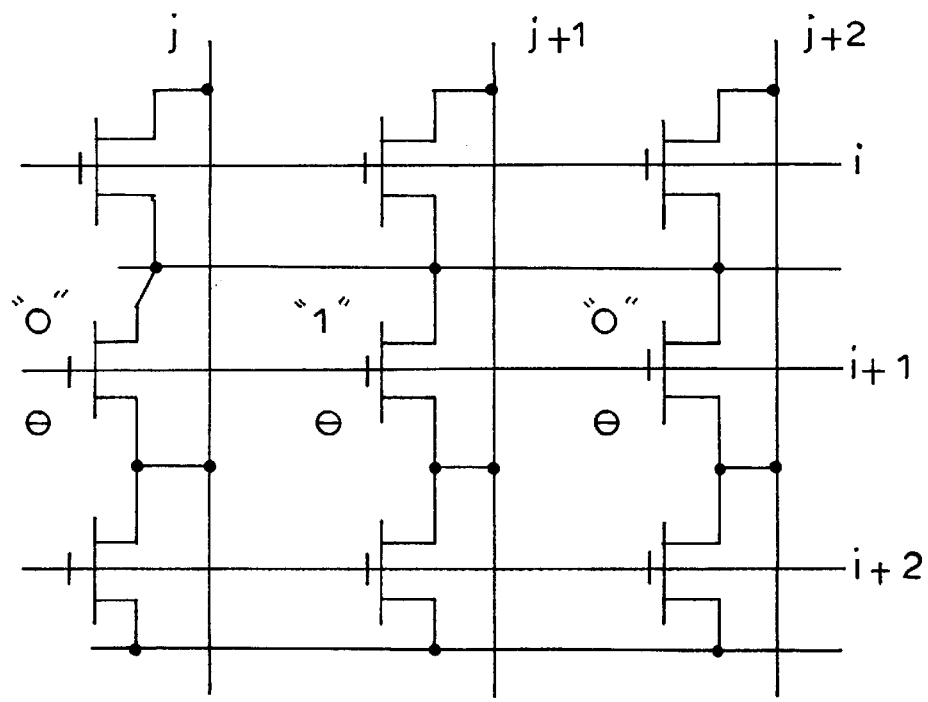

FIG. 6A illustrates the flash programming wherein word line i+1 is selected to store the following information: "0" for cell j, "1" for cell j+1, and "0" for cell j+2. For the chosen word-line i+1, a high voltage will be applied to the chosen word-line i+1, while all of the other unselected word-lines will be at ground. All the bit-lines and the common source line will be left floating with the substrate held at ground or at a negative bias, as indicated in FIG. 6A. Since word-line i+1 is at high voltage, electrons will be injected from the cell channel into the floating gates for all of the memory cells sharing word-line i+1. Therefore, after flash programming on the selected word-line i+1, electrons are stored in the floating gates as illustrated in FIG. 6B. The memory cell has an extra electron on the floating gate, meaning a high cell threshold voltage, which is designated as state "0" in FIG. 6B.

Since the desired information to be stored in word-line i+1 is "0 1 0" for the selected cells j, j+1 and j+2, respectively, the particular cell located at bit-line j+1 and word-line i+1 now needs to be erased (i.e., extra electrons removed from the floating gate) to become neutral (i.e., no extra electrons, meaning a low cell threshold voltage) at state "1". To accomplish the above task, the second array operation, selective erase, must be performed.

To selectively erase the stored charge from a selected memory cell, in the illustrated instance from the memory cell located at word-line i+1 and bit-line j+1, the array is biased as illustrated in FIG. 6C. The selected word-line i+1 is provided with a negative bias in the range of –7V to –10V, the unselected word-lines are held at either ground or 3V to 5V, the selected bit-line j+1 is biased at 3V to 5V, the unselected bit-lines are held at either ground or floating, and, the source lines are also held at either floating or ground. Electrons will tunnel from the floating gate of the selected cell, which is at lower potential due to the –7V to –10V bias on the selected word line, to the drain region of the substrate, which is at positive potential. In the foregoing manner, therefore, byte level memory programming via flash programming and selective erasing of one or a plurality of the inventive high density stacked gate cells, can be achieved.

As alluded to above, individual memory cell erasure provides the capability for implementing multi-valued logic states. Feedback control is provided to prevent over-erasure of a cell by monitoring the cell current after each erasing pulse is applied to the selected bit line, for example, by comparison of the sensed current to the cell current of a reference cell. By implementing the feedback loop control circuit during the cell erase operation, one can reasonably control cell current, and hence the cell threshold voltage, within a certain range. One can further categorize various current ranges into discrete intervals, for example, I<50 $\mu$A; 50 $\mu$A$\leq$I<100 $\mu$A; 100 $\mu$A$\leq$I<150 $\mu$A and 150 $\mu$A$\leq$I, where I is the cell current. Each current interval may then be designated as a logic state; for example, 00; 01; 10; 11. For this four-valued logic, four reference cells, one each at the relevant current level, would be used for the feedback control sensing.

Given the density of the array and the fact that the tunnel dielectric and interpoly dielectric films are both rather thin, memory cell disturbance problems can occur during array programming and read operations, imposing certain limitations on how many memory cells can share the same bit-line or word-line. In such a case, the bit-line (for the sake of example) can be divided into several sections, each section consisting of a smaller number of memory cells having a pass transistor to connect to the bit-line, as illustrated in FIG. 7. The section connected by the pass transistor is selected by applying a high voltage to the gate of the pass transistor. Similarly, the pass transistor arrangement can be applied along a word-line if gate disturbance is a concern.

Figure 10:
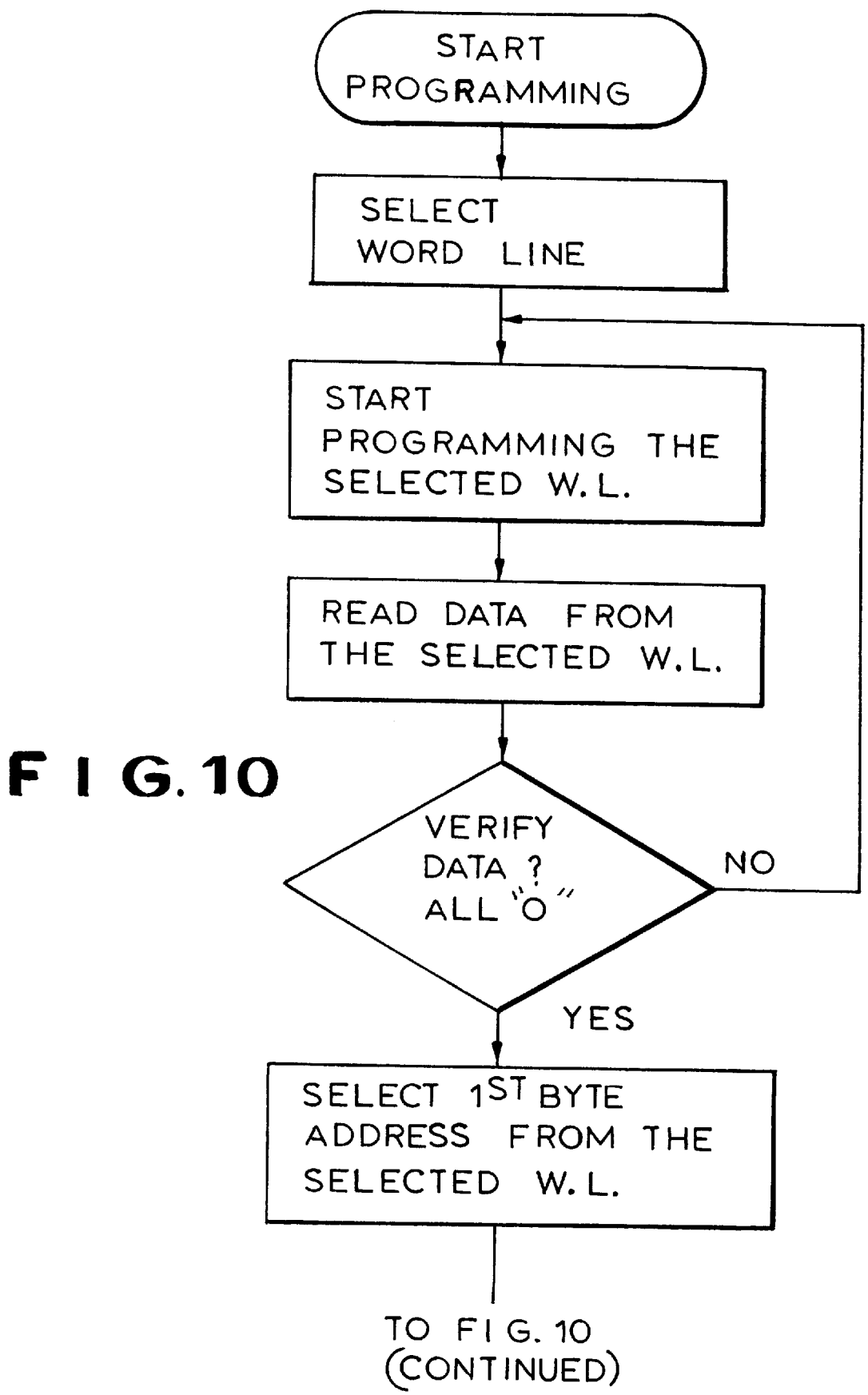
FIG. 10 illustrates a representative programming process flow of the present invention.
Figure 10:
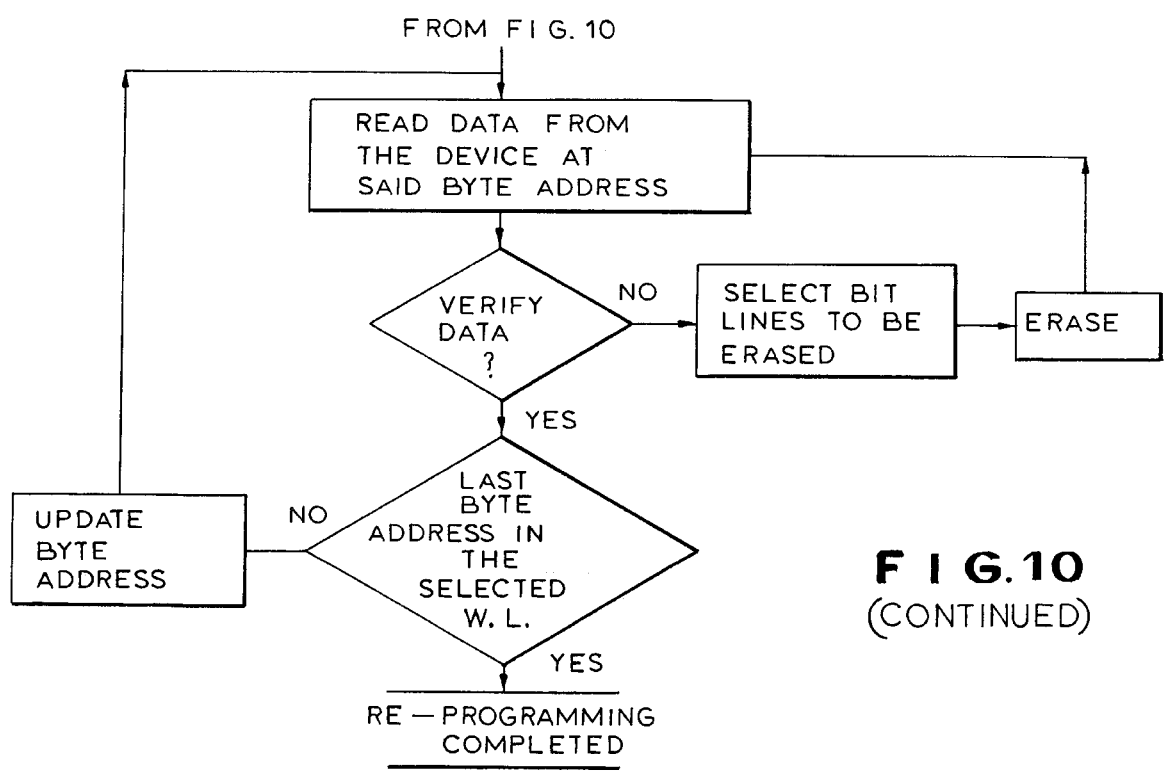

It will now be apparent from the above-detailed cell structure, array architecture and array operation, that an intelligent array programming algorithm can be implemented either on-chip with a circuit design or off-chip with an external microcontroller (i.e., a software implementation). FIG. 10 illustrates a representative programming algorithm which performs the above-described programming function.

Step 101 of the programming process flow of the present invention is labeled as the start of programming. Before starting the programming of the memory array, the digital information to be stored is either known to the operator/programmer or is translated by the program from the operator input to the appropriate digital pattern. Assuming, therefore, that the locations of cells to be programmed are known, the word and bit lines associated with the cells are also known. At Step 102, therefore, the program selects the word line along which a first cell to be programmed is found. Flash programming of the selected word line is performed at Step 103, after which the data is read from the selected word line at 104. Flash programming, as detailed with reference to FIG. 6A–6C, is conducted by applying a high voltage to the selected word line while maintaining other lines in a floating, ground, or low voltage. Upon reading the data along the word line, the program seeks to verify if all data along the selected word line has the value "0", as denoted in the decision box at 105. (The system could also be verifying that all cells have the value "1" if such value was desired, as will be apparent to one having skill in the art.) The steps subsequent to the verification at Step 105, depend upon the results of the query at decision box 105. If not all of the data along the selected word line has the value "0", then, as indicated along line 106, the flash programming of 103 is repeated until all of the cells along the selected word line have the same value. If, however, data verification indicates that all relevant cells have the appropriate value along line 107, then the selective erasing is commenced, if needed.

At Step 108, a first byte address along the word line is selected and the data is read at Step 109 from the cell at the selected address. The system next verifies, at Step 110, that the data value at the byte address is the intended value (i.e., under the current example, "should the cell along the selected word line at the selected byte address be '0'?"). If the value is not as intended, as indicated along line 111, then the program selects the bit line along which the cell with the relevant byte address is located, at Step 112. An erase operation is then performed, at Step 113, in accordance with the details described with reference to FIGS. 6A–6C. As noted therein, several erase iterations may be required until the data verification step for a single byte address indicates that the cell has the appropriate data value.

If the data at the byte address is as intended, which is indicated along line 114, then the program determines if all of the byte addresses in the selected word line have been read and verified, at Step 115. If not all of the byte addresses have been verified, as indicated along line 117, then the byte address is updated (i.e., the "next" byte address along the word line is selected) at Step 118 and thereafter Steps 109–115 are repeated as necessary. Once the data value at the last byte address on the selected word line has been verified, indicated by line 116 out of decision box 115, then the programming is complete.

As will be apparent to one having skill in the art, modifications can be made to the programming flow, structure, materials, and processes detailed herein without departing from the spirit and scope of the present invention as defined by the appended claims.

What is claimed is:

1. A process for writing to a selected cell, having source and drain regions, a first gate and a floating gate, in a memory array of a single transistor $E^2PROM$ device known as a flash memory comprising a plurality of memory cells interconnected by a plurality of word lines, a plurality of bit lines orthogonal to said word lines, and a plurality of common source lines comprising the steps of:

identifying the word line and bit line connected to the selected cell of said flash memory;

flash programming the cells of said flash memory connected to said identified word line, said programming comprising applying a voltage to said identified word line which is higher than the voltage on said substrate; and controlled erasing said selected cell of said flash memory, said controlled erasing comprising applying a voltage to said identified bit line which is higher than the voltage on said selected word line, sensing the current on the selected cell and controlling the application of said voltage in response to a value of said sensed current.

2. The process of claim 1 further comprising determining the appropriate value of current for said selected cell and repeating said step of applying said voltage if said sensed current is different from appropriate value of current.

3. A process for writing to a selected cell in a memory array of a single transistor $E^2PROM$ device known as a flash memory comprising a plurality of memory cells interconnected by a plurality of word lines, a plurality of bit lines orthogonal to said word lines, and a plurality of common source lines, the selected cell of said flash memory having a source region and a drain region, a first gate and a floating gate, said process comprising the steps of:

identifying a word line and a bit line connected to the selected cell of said flash memory;

flash programming the selected cell of said flash memory connected to said identified word line, said programming comprising injecting electrons into said floating gate of the selected cell of said flash memory from a channel region between the source region and the drain region of the selected cell; and controlled erasing the selected cell of said flash memory, said controlled erasing comprising moving said electrons from said floating gate of the selected cell of said flash memory to the drain region of the selected cell, sensing the current on said selected cell and controlling the movement of said electrons from said floating gate of said selected cell of said flash memory in response to a value of said sensed current.

4. The process of claim 3 wherein controlled erasing at said selected cell comprises the steps of:

determining the appropriate value of current for said selected cell from a plurality of ranges of values of current;

removing electrons from said selected cell;

sensing the current on said selected cell;

comparing sensed current to the appropriate value of current; and repeating said removing, sensing and comparing until said sensed current is within said appropriate range of current.

5. The process of claim 1 further comprising sensing the current on said selected cell;

comparing the sensed current to a reference value; and repeating said programming if said sensed current is less than said reference value.

6. The process of claim 3 further comprising sensing the current on the selected cell;

comparing the sensed current to a reference value; and repeating said programming if said sensed current is less than said reference value.

7. The process of claim 3 further comprising determining an appropriate value of current for the selected cell; and repeating said movement of electrons from said floating gate if said sensed current is different from said appropriate value of current.

8. The process of claim 1 wherein controlled erasing at said selected cell comprises the steps of:

determining the appropriate value of current for said selected cell from a plurality of ranges of values of current;

applying a voltage to said identified bit line which is higher than the voltage on said selected word line;

sensing the current on said selected cell;

comparing sensed current to the appropriate value of current; and repeating said applying a voltage, sensing and comparing steps until said sensed current is within said appropriate range of current.

* * * * *